United States Patent [19]
Nagai et al.

[11] Patent Number: 5,604,386
[45] Date of Patent: Feb. 18, 1997

[54] SWITCH DEVICE AND WIRING STRUCTURE THEREFOR

[75] Inventors: Shigekazu Nagai; Shunichi Notoyama; Shigeru Sugano; Akio Saitoh, all of Ibaraki-ken, Japan

[73] Assignee: SMC Kabushiki Kaisha, Tokyo, Japan

[21] Appl. No.: 193,061

[22] PCT Filed: Sep. 10, 1992

[86] PCT No.: PCT/JP92/01159

§ 371 Date: Mar. 8, 1994

§ 102(e) Date: Mar. 8, 1994

[87] PCT Pub. No.: WO93/05491

PCT Pub. Date: Mar. 18, 1993

[30] Foreign Application Priority Data

Sep. 10, 1991 [JP] Japan .................................. 3-230633

[51] Int. Cl.⁶ .................................................. H01H 35/00
[52] U.S. Cl. ............................ 307/118; 73/4 R; 307/112
[58] Field of Search ................................... 307/118, 112, 307/113, 115, 125, 116; 73/4 R, 4 V, 3, 146.5

[56] References Cited

FOREIGN PATENT DOCUMENTS 3-38110  2/1991  Japan .

*Primary Examiner*—William M. Shoop, Jr.
*Assistant Examiner*—Jonathan S. Kaplan
*Attorney, Agent, or Firm*—Oblon, Spivak, McClelland, Maier & Neustadt, P.C.

[57] ABSTRACT

The present invention relates to a switch device having a sensor for effecting a detection process such as a confirming the operation of an ejector or the like, confirming the existence of an object fed by a suction pad, or confirming the attracted state of an object fed by the suction pad. The invention further relates to a control device-to-sensor wiring structure which is electrically connected to the switch device. The switch device can be reduced in size and weight by detachably positioning a setting section, having a controlling means and a displaying means, on a body of the switch device and removing the setting section as required. Further, the wiring structure makes it possible to simplify wiring and avoid the possibility of miswiring, by eliminating the need for a power line to be connected to each sensor.

13 Claims, 15 Drawing Sheets and the control device via a signal line, or may be
carried out by the supply of power to the sensor under
a predetermined power supply mode.

SWITCH DEVICE AND WIRING STRUCTURE THEREFOR

TECHNICAL FIELD

The present invention relates to a switch device having a sensor for effecting a detection process such as confirming the operation of an ejector or the like, confirming the existence of an object fed by a suction pad, or confirming a suction status of the object fed by the suction pad. The invention further relates to a wiring structure provided between individual sensors and at least one control device electrically connected to the switch device. The present invention relates particularly to a control device-to-sensor wiring structure capable of simplifying wiring arrangements without requiring a power line connected separately from a signal transmitting means to each of the sensors.

BACKGROUND ART

In recent years, switch devices such as pressure switches, proximity switches, photoelectric switches, etc. have a tendency to perform multiple functions, including additional functions such as trouble precognition and an analog output functions, etc. as well as merely performing a signal on/off output function. Further, setting sections and displays or the like corresponding to the respective switch devices become complicated as the demand for multiple functions increases, as compared with the devices employed in the prior art.

A pressure switch according to the prior art will now be shown in FIG. 1 as an illustrative example.

The pressure switch 1 has a display 3 for displaying a pressure thereon, which is provided on an upper surface of a body 2 shaped substantially in the form of a rectangular parallelopiped. A pressure setting screw 4 formed of a minus screw, and an operation indicator or operation pilot lamp 5 for indicating the state of operation of the pressure switch 1, are disposed adjacent to the display 3. A desired pressure value is set by turning the pressure setting screw 4. For example, a semiconductor pressure sensor (not shown) is incorporated in the body 2 to detect the pressure of air introduced from an opened pressurized air introduction port 6, and for converting the pressure into an electric signal. Further, a conductor unit 7 is provided extending from one surface of the body 2, which is opposite to the pressurized air introduction port 6, to drive the semiconductor pressure sensor and supply a detected signal to an unillustrated external fluid device. A cylindrical member 8 having a pressurized air introduction port 6 opened at its tip portion is integrally connected to a lower portion of the body 2. A male screw 9 for connecting and fixing the cylindrical member 8 to another device is formed on the outer periphery of the cylindrical member 8, and permits the cylindrical member 8 to communicate with a fluid passage through which the pressurized air flows.

However, a setting section comprised of the display 3 and the pressure setting screw 4 or the like is not always necessary for the pressure switch 1 according to the prior art. The setting section is merely used to confirm and adjust a preset pressure to be used when the pressure is set in advance, or when troubles such as an excessive pressure, overcurrent, etc. have occurred, or merely used for maintenance and inspection of the pressure switch 1.

Further, recent control devices have an increased capacity for so-called artificial intelligence. It is thus necessary to provide power lines, control signal lines or a number of various conductors or wires between the control devices and sensors for the purpose of communication or the like. Further, the sensors for detecting various control states of the signal lines used for controlling the control devices, or those of the control devices, need power sources for driving circuits in addition to the signal lines.

When a transistor is used for driving a sensor, for example, it is necessary to provide a ground line, a power line and a signal line when using either PNP or NPN type transistors. In the case of each control device, on the other hand, it is necessary to provide, for example, wires for activating the drivers used for actuators including fluid pressure and electrical operations, a power line or a power line or the like used for a control circuit.

However, inconvenience or undesired troubles are developed in that when the signal line, the ground line and the power line are respectively provided in a separate manner, the wiring structure becomes complicated. Further, when the signal line, the power line, etc. are collectively wired, they interfere with each other so as to produce noise, and hence a desired control cannot be performed. Further, a drawback also arises in that miswiring can result during wiring.

SUMMARY OF THE INVENTION

Therefore, an object of the present invention is to provide a switch device capable of avoiding functional difficulties of a conventional switch device, the invention comprising only essential components, and providing an improvement in general-purpose properties by virtue of the simplification of structure of the switch device, and a reduction in size and weight thereof.

Another object of the present invention is to provide a control device-to-sensor wiring structure capable of substantially eliminating a power line used for a sensor which is attached to a switch device, thereby simplifying the structure of the switch device while avoiding the possibility of miswiring, and remarkably reducing the amount of space required to mount the device, and reducing the generation of noise to as low a value as possible. The sensor may comprise one including a switching device for performing ON/OFF control or the like.

DISCLOSURE OF THE INVENTION

In the switch device according to the present invention, a body, a setting section and an adjustment section are respectively independently provided in a separate manner. Thus, when a pneumatic apparatus is used in normal operation, it is unnecessary to connect the setting section and the adjustment section to each other. Accordingly, the space required to connect them to one another can be reduced. When maintenance and inspection of a pneumatic apparatus which has developed trouble is required, the adjustment section and the setting section can be easily coupled to the body. Further, a reduction in size and weight of the switch device makes it possible to simplify the setting of the pneumatic circuit by the pneumatic apparatus. When a pneumatic circuit is formed by a number of pneumatic apparatuses, a further general purpose improvement in the properties of each pneumatic apparatus can be made.

In the control device-to-sensor wiring structure according to the present invention, only a signal line capable of transmitting a control signal to at least one corresponding sensor is connected to the sensor. At this time, the sensor is grounded. The supply of power to the sensor may be carried out by a current which leaks from power transferred between a low voltage sequencer and a driver, for example. A power supply such as a solar battery, a bioelectric battery or the like, which does not need charging, may be incorporated in the sensor. In doing so, the wiring can be made relatively simple. Further, since the number of conductors or wires can be reduced, inconvenience such as miswiring or the like can be avoided. Moreover, since the power line is not directly disposed closely to a sensor, it is possible to prevent the sensor from malfunctioning due to the generation of noise or the like. Incidentally, the technical idea of the present invention can be used even when a CPU, an amplifier, etc. are operated through signal lines.

BEST MODE FOR CARRYING OUT THE INVENTION

A switch device and a wiring structure suitable for use in the switch device, according to the present invention, will hereinafter be described in detail by preferred embodiments with reference to the accompanying drawings.

Figure 1:
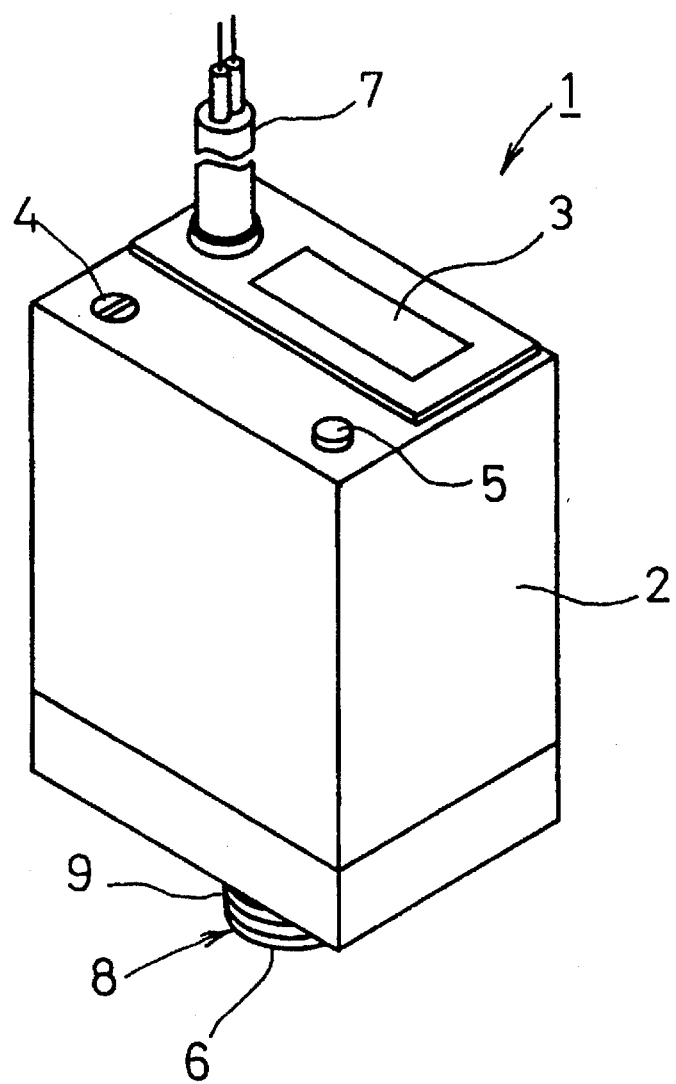
FIG. 1 is a perspective view showing a pressure switch according to the prior art.
Figure 2:
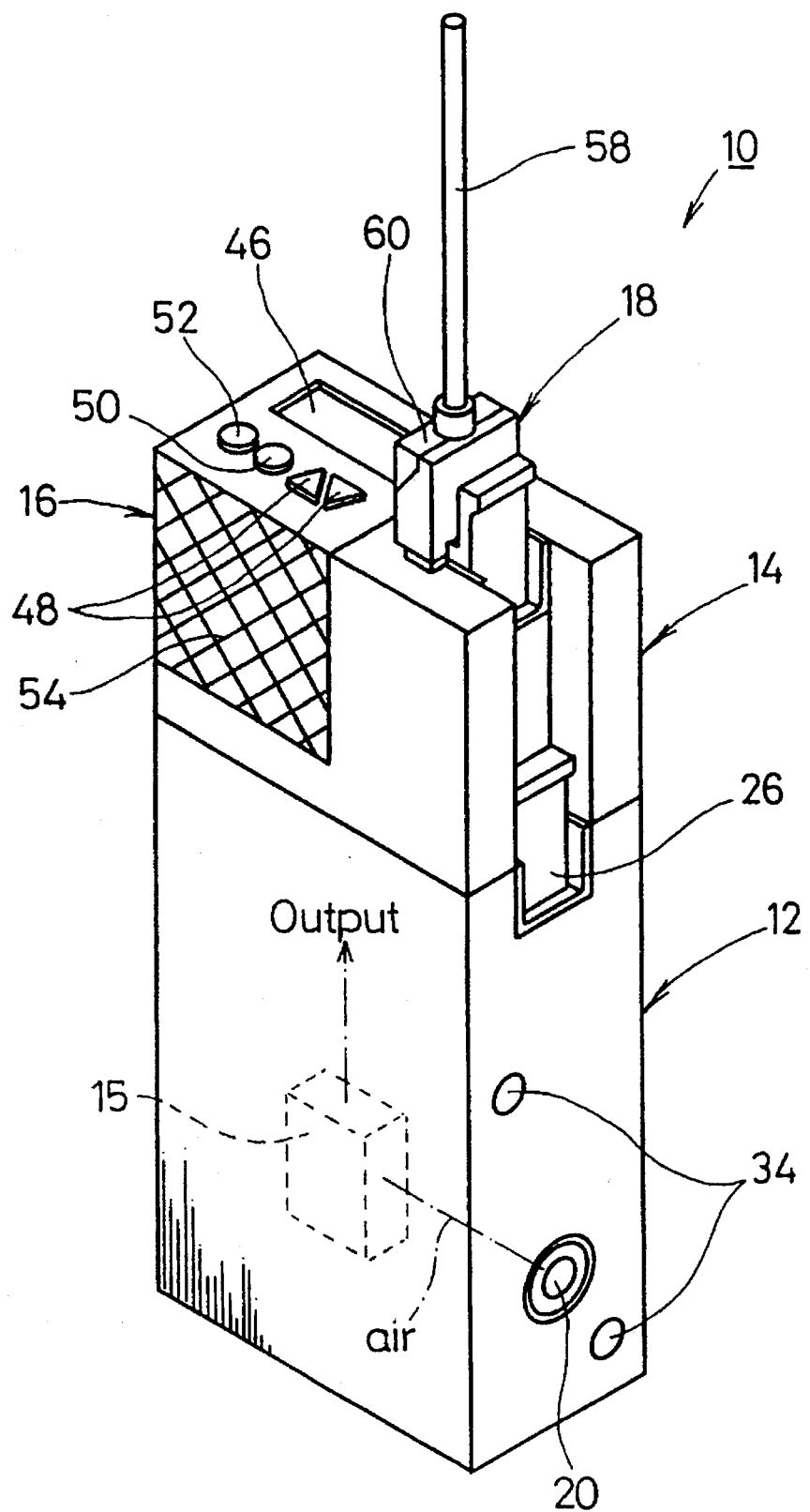
FIG. 2 is a perspective view illustrating a vacuum pressure switch according to one embodiment of the present invention.
Figure 3:
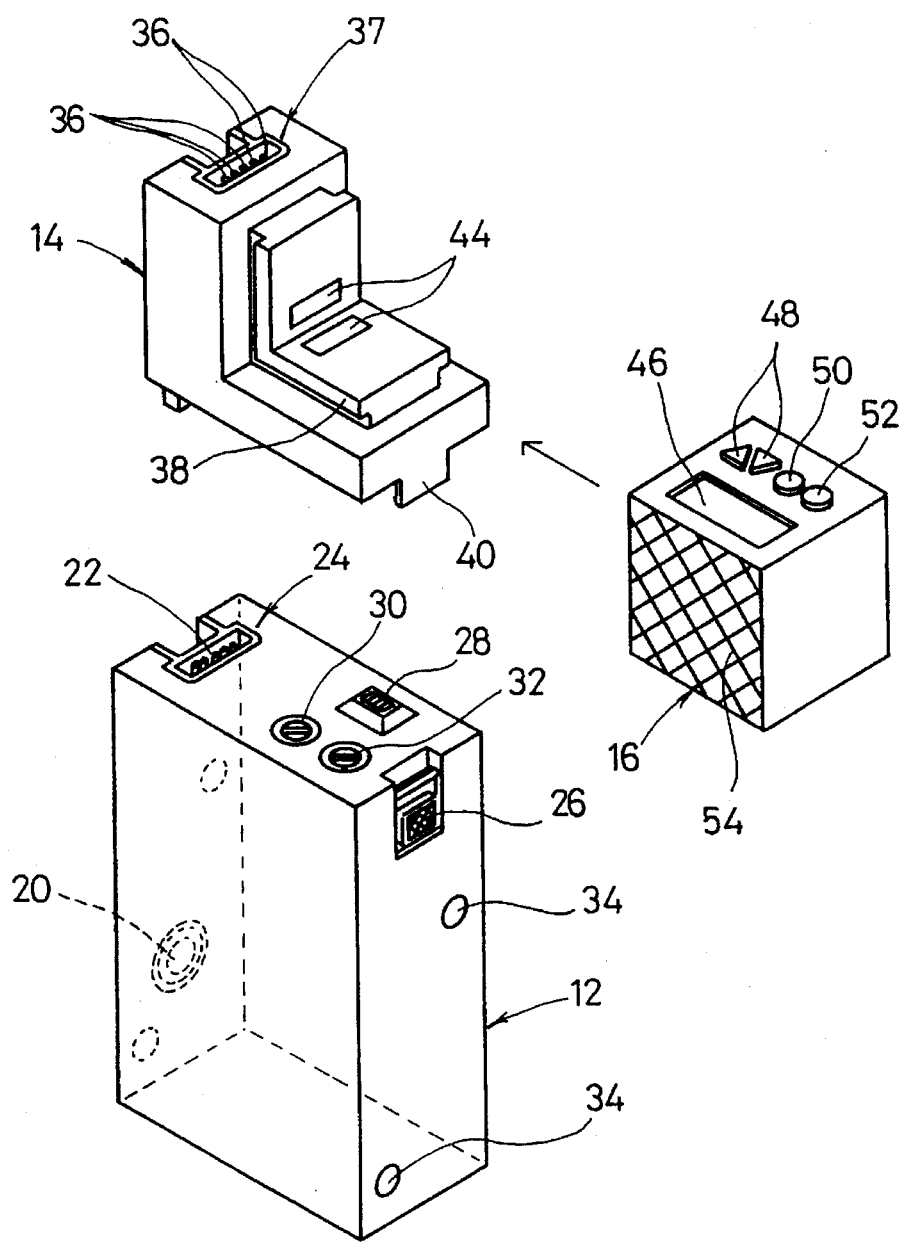
FIG. 3 is an exploded assembly diagram of the vacuum pressure switch shown in FIG. 2.

FIG. 2 is a perspective view illustrating a vacuum pressure switch according to a first embodiment of the switch device of the present invention. FIG. 3 is an exploded assembly diagram of the vacuum pressure switch shown in FIG. 2.

The vacuum pressure switch 10 basically comprises a body 12, a control unit 14, a control module 16 and a connector unit 18, all of which are individually provided in a separate manner.

More specifically, the body 12 is shaped in the form of a rectangular parallelopiped. Further, the body 12 has, for example, a semiconductor pressure sensor 15 incorporated therein as a detecting element for detecting a pressure of a fluid introduced through a vacuum communicating or connecting port 20. The semiconductor pressure sensor 15 comprises a semiconductor pressure sensor capable of providing binary output signals, and which outputs a high level on-state signal when the pressure of the introduced air exceeds a preset pressure, and which outputs a low level off-state signal when the pressure is less than the preset pressure. The output signals are supplied to a terminal 24 attached to one end of an upper surface of the body 12, and having a plurality of pins 22 engraved therein (see FIG. 3). The output signals sent to the terminal 24 are supplied to an external device to which the connector unit 18 (to be described later) is electrically connected. A mounting member 26 for coupling the control unit 14 to the body 12 through a one-touch system is attached to the other end of the upper surface of the body 12. Further, circular trimmers and a rectangular operation display 28 are centrally disposed between both ends of the upper surface of the body 12. The trimmers comprise a pressure setting trimmer 30 and a corresponding-difference setting trimmer 32. In this case, for example, an increase and decrease in the degree of vacuum to be set can be made by rotating screws in clockwise and counterclockwise directions through minus grooves centrally defined in the circular trimmers.

The term "corresponding-difference", as employed in the corresponding-difference setting trimmer 32 implies a difference between a pressure for bringing the output signal to an on-state when the pressure detected by the semiconductor pressure sensor reaches the preset pressure and a pressure for bringing the output signal to an off-state when the pressure is reduced after the detected pressure has reached the preset pressure.

Further, the operation display 28 has an LED, an LCD, a color LCD or the like incorporated therein. The operation display 28 will light up and carry out a display process when the pressure detected by the semiconductor pressure sensor 15 reaches the preset pressure, so that the output signal is brought to an on-state. The vacuum connecting port 20 for introducing a detected fluid therein is defined in a side surface perpendicular to one side surface of the body 12, and which includes a terminal 24 and the like. There are also provided two mounting holes 34 corresponding to through holes extending through a side surface opposite to the one side surface.

The control unit 14 includes a terminal 37 having a plurality of pins 36 disposed in an upper surface thereof, for connecting the connector unit 18 to the terminal 37, and an engagement portion 38 for coupling the control module 16 to the control unit 14. Further, the control unit 14 is provided with projections 40 extending vertically from both ends of the bottom thereof, each of the projections being inserted into and fixed to the mounting member 26 of the body 12. The engagement portion 38 for coupling the control module 16 to the control unit 14 extends along both orthogonal axes (i.e. ordinate and abscissa) and is shaped in the form of a convex portion centrally bent at a right angle. Thus, opposite grooves 42 (see FIG. 4) which are defined in the control module 16 slide along the engagement portions 38 of the control unit 14 from either one of the vertical and horizontal directions, thereby making it possible to couple the control unit 14 and the control module 16 to each other. Further, terminals 44 used for the control module 16, each of which is shaped in the form of a plate for providing an electrical connection, are provided on corresponding vertically-crossed surfaces of the engagement portion 38, for joining the control module 16 to the engagement portion 38.

Figure 4:
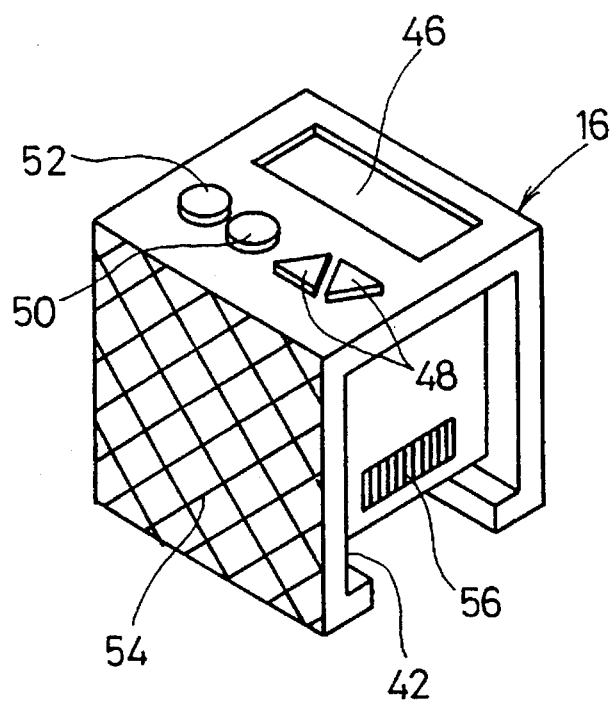
FIG. 4 is a perspective view showing one example of a control module.
Figure 5:
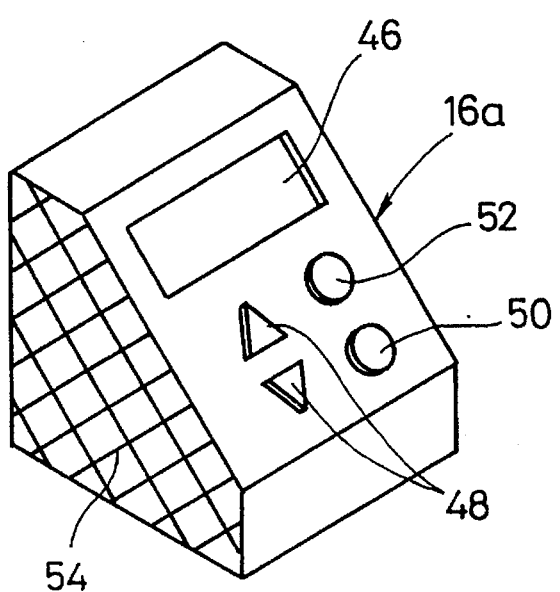
FIG. 5 is a perspective view illustrating another example of a control module.

FIGS. 4 and 5 are perspective views showing the control module 16 and a control module 16a, respectively. FIG. 4 shows one example of the control module 16 shaped substantially in the form of a cube. FIG. 5 illustrates another example of the control module 16a shaped substantially in the form of a triangular prism or pole. Since the respective structural elements employed in FIGS. 4 and 5 are identical to each other except for their shapes, the same structural elements are identified by like reference numerals and will be described below.

Figure 6:
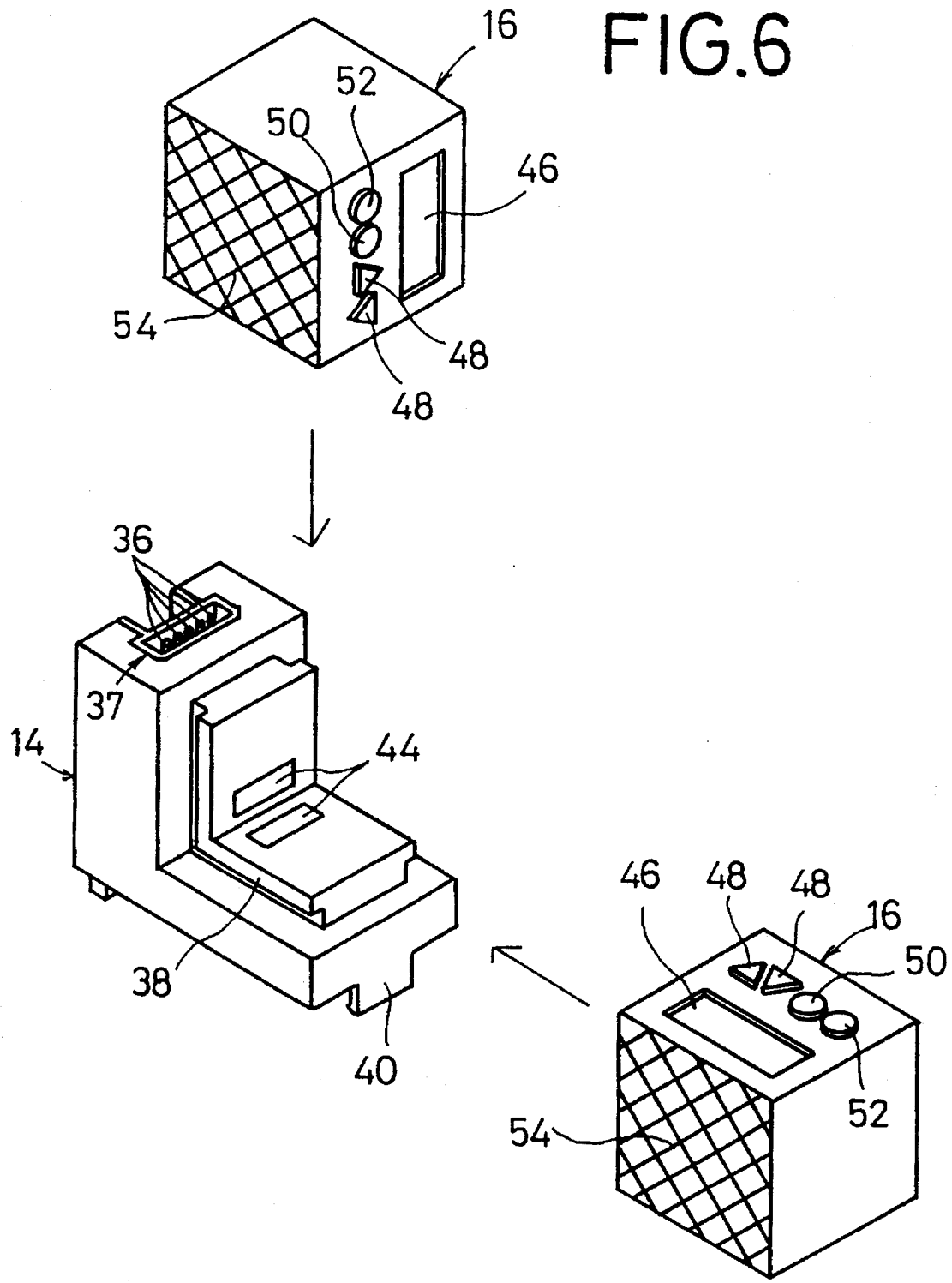
FIG. 6 is a view illustrating the manner of connection of the control modules as shown in FIG. 4 to a control unit.
Figure 7:
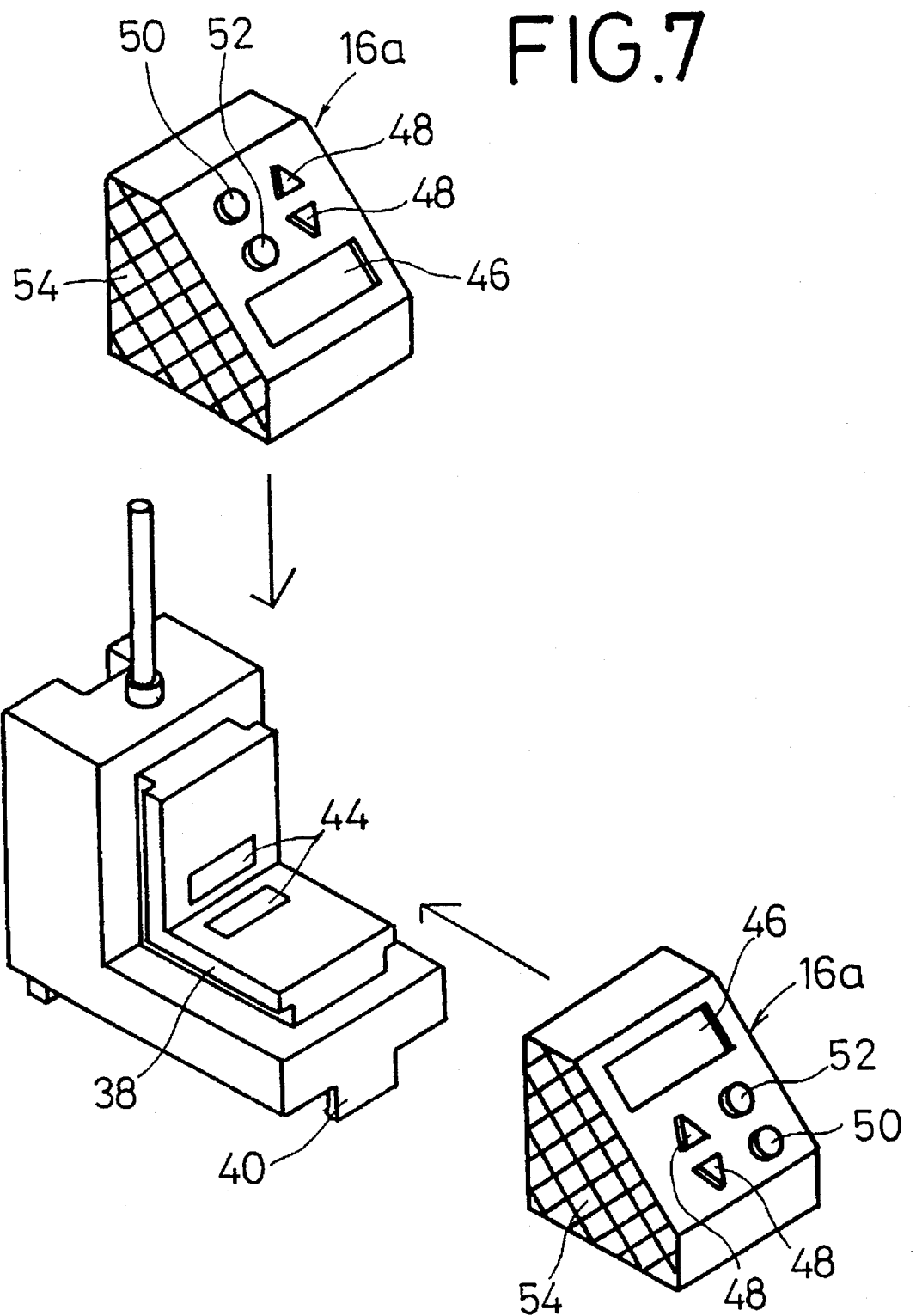
FIG. 7 is a view illustrating the manner of connection of the control modules as shown in FIG. 5 to a control unit.

Use of the control module 16 is often inconvenient in that, for example, the orientation of the operation surface changes depending on the state of connection between the control module 16 and the control unit 14, and thus a display is hard to see. It is thus necessary to rearrange the control module 16 as needed (see FIG. 6). On the other hand, when the control module 16a is used, the upward and downward directions are reversed but the direction of the operation surface remains substantially constant. Therefore, the display may be conveniently viewed irrespective of the state of connection between the control module 16a and the control unit 14. It is thus possible to carry out a mounting or connecting process without worrying about the state of connection between the control module and the control unit (see FIG. 7).

The control module 16 has a controller disposed therein-side, of a type wherein an unillustrated control circuit is provided on a printed board. On one side surface of the control module 16 there are provided, respectively, a color LCD panel 46, which serves as a display means for displaying preset detection conditions thereon, set buttons 48 shaped substantially in the form of triangles, a mode selection button 50 shaped substantially in the form of a circle, and an illumination switch 52. The color LCD panel 46 provides a visual display in the form of characters (such as katakana, kanji, etc.) and can display a warning, a mode, a set mode, a unit (which is also convertible into another unit on the LCD panel 46), etc. as well as pressures, etc. thereon. The illumination switch 52 is used to illuminate the color LCD panel 46. Further, mesh-like grooves 54, which are used as an antislipping means, are engraved in both opposite side surfaces of the control module 16. When it is desired to connect the control module 16 to the control unit 14, they are slid together in such a manner that a rubber connector 56 attached to one side surface of the control module 16 is brought into contact with each corresponding terminal 44 of the engagement portion 38 of the control unit 14, thereby connecting the control module 16 and the control unit 14 to each other. Thus, the contact between the rubber connector 56 and each terminal 44 can provide electrical connections between the control module 16 and the control unit 14. The rubber connector 56 is constructed by stacking and sandwiching conductive elastic members and non-conductive elastic members one after the other, and holding both side surfaces of the stacked product by the non-conductive elastic members from both sides. Incidentally, the control module 16 and the control unit 14 are connected to each other so as to serve as a setting portion or section.

A lead wire or conductor 58 having a predetermined length, and which serves as a signal transmitting means, is electrically connected to the connector unit 18. For example, the conductor 58 enables an output signal to be supplied to an unillustrated fluid device such as a sequencer or the like so that the fluid device is controlled. Further, holes (not shown) which are fitted to the plurality of pins 22 and 36, and which respectively form the terminals 24 and 37, are defined in the bottom of the connector unit 18. Moreover, a rectangular operation display 60 having an LED, an LCD, a color LCD or the like incorporated therein is provided at the corner of the connector unit 18. Incidentally, the connector unit 18 may be electrically connected to either the body 12 or the control unit 14 using the aforementioned rubber connector 56.

Operation of the vacuum pressure switch 10 constructed as described above will be described below.

Figure 8:
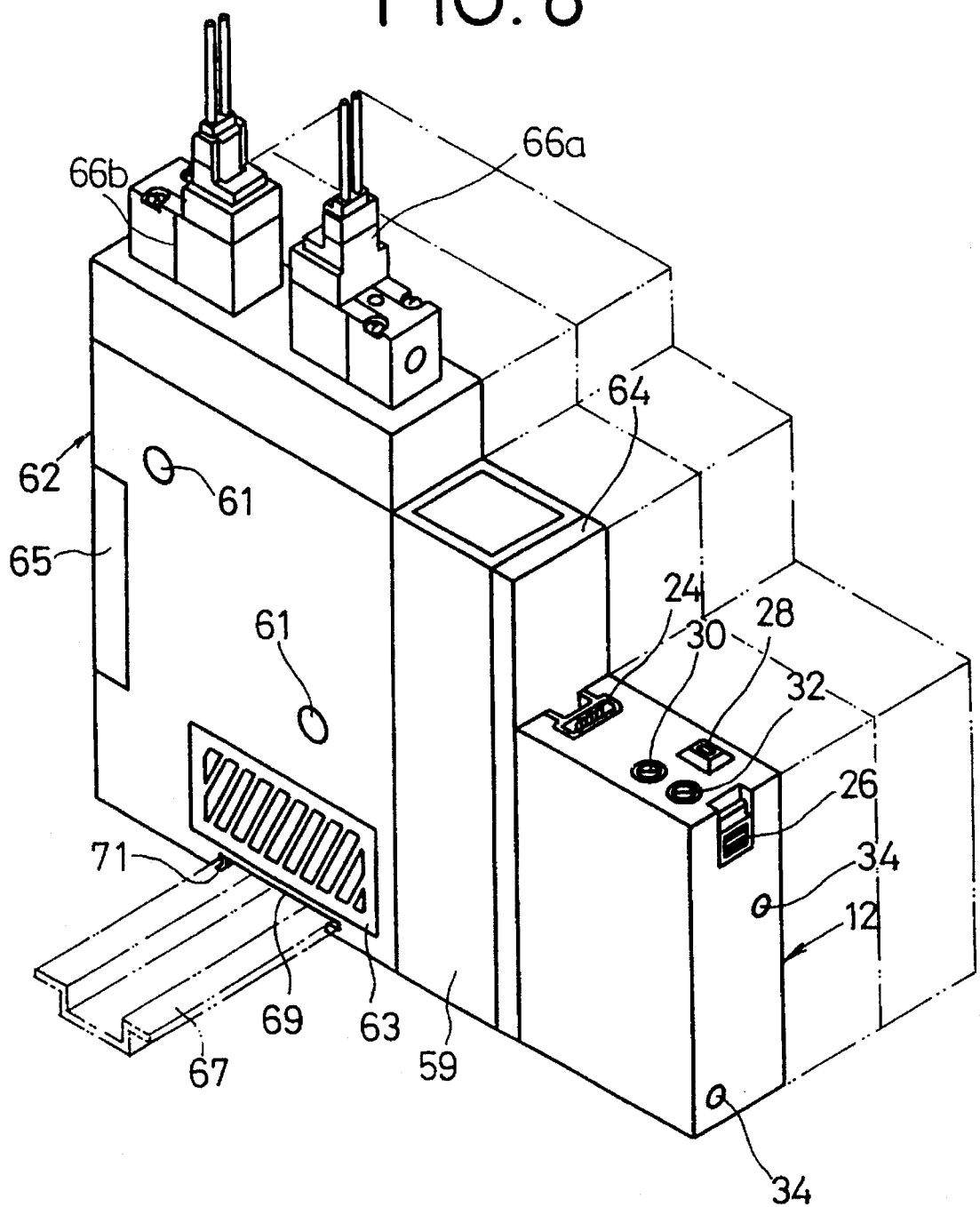
FIG. 8 is a perspective view showing the manner in which a body of the vacuum pressure switch shown in FIG. 2 has been coupled to an ejector.

As shown in FIG. 8, a fluid port (not shown) is defined in a connecting portion 64 of an ejector block 59, which serves as a vacuum generating device. The fluid port is airtightly coupled to a vacuum communicating or connecting port 20 of the body 12. By mounting the body 12 onto the ejector block 59, a fluid passage (not shown) provided inside the ejector block 59 is placed in communication with a passage which communicates with a semiconductor pressure sensor of the body 12. Opposite grooves 42 defined in a control module 16 are fitted to an engagement portion 38 of a control unit 14 in alignment with the engagement portion 38 so that the grooves 42 are slided and fitted to the engagement portion 38 from either a vertical or horizontal direction. At this time, terminals 44 used for the control module, which are mounted on the engagement portion 38 of the control unit 14, and a rubber connector 56 provided on a side surface of the control module 16 are connected and brought into contact with each other. Thereafter, a connector unit 18 having a conductor 58 is inserted into a terminal 37 provided on an upper surface of the control unit 14.

Thus, the control module 16 is electrically connected to the control unit 14. Further, each of opposite projections 40 provided at the bottom of the control unit 14 are inserted into and connected to a corresponding mounting member 26 of the body 12 so that the connector unit 18 is connected to the terminal 37 of the control unit 14. A pilot-operated electromagnetic feed valve 66a, which is used to control a fluid passage provided within the ejector block 59, and a pilot-operated electromagnetic vacuum breakage valve 66b are mounted on the valve block 62. Further, mounting holes 61, a silencer 63 and a suction filter cover 65 are provided within a side surface of the valve block 62. Moreover, a groove 69 for receiving a connecting rail 67, which is used to manifold a plurality of vacuum generating devices through the connecting rail 67, is defined in the bottom of the valve block 62. An interlocking means 71 is detachably engaged with the connecting rail 67 by a pair of opposed springs and is provided within the groove 69. The ejector block 59 has an unillustrated nozzle provided therein, from which a pressurized fluid is emitted or discharged so as to create a vacuum.

As a result, a work or the like is attracted to or sucked under the vacuum state through an unillustrated port.

Figure 9:
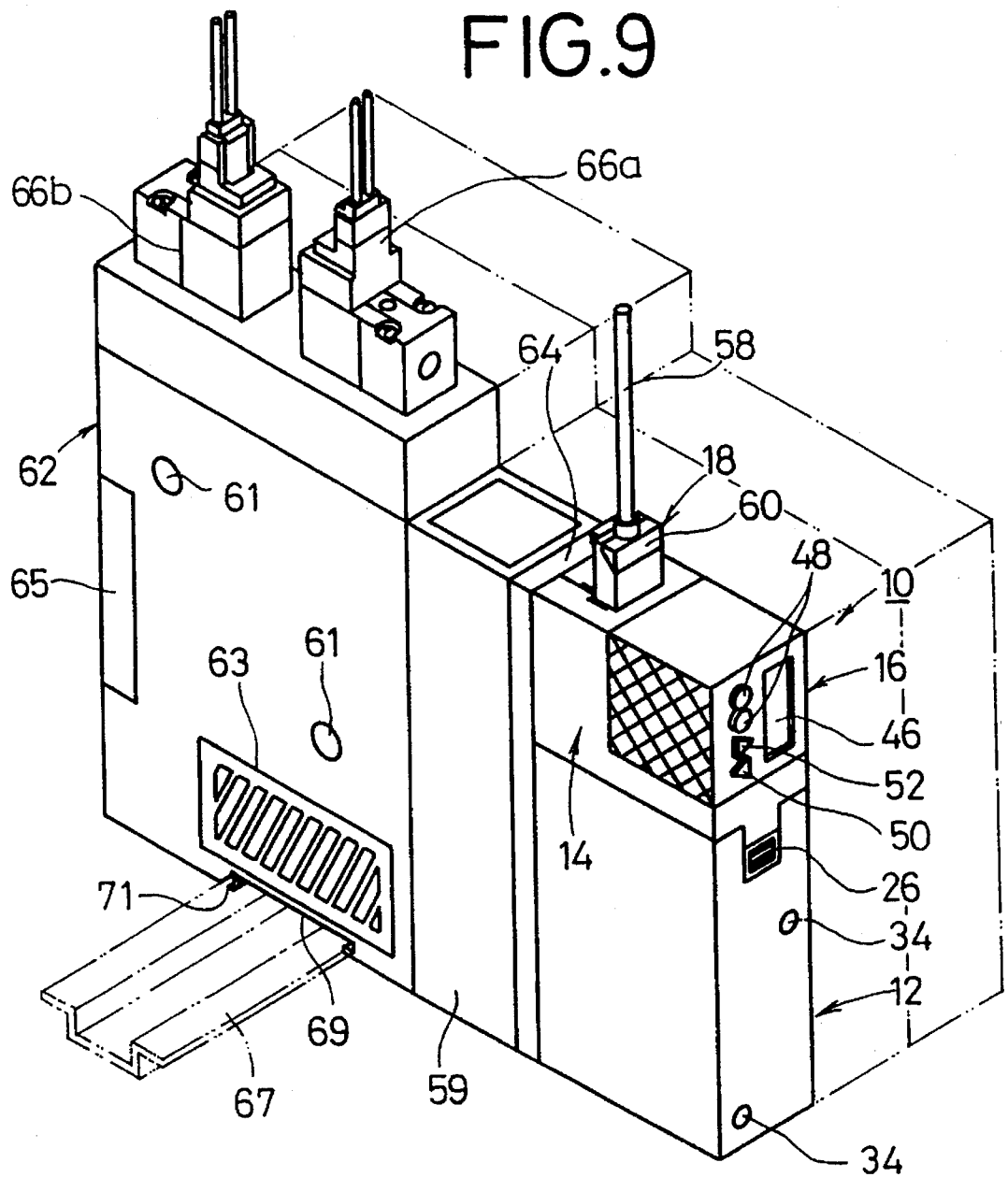
FIG. 9 is a perspective view showing the manner in which a vacuum pressure switch has been connected to an ejector.

A vacuum pressure switch 10 integrally formed by connecting side by side a body 12, a control unit 14, a control module 16 and a connector unit 18 may be directly attached to an ejector block 59, as shown in FIG. 9. Alternatively, the control unit 14 may be connected first to the body 12, and the resulting combination connected to the ejector block 59. Finally, the control module 16 may be connected to the control unit 14.

When the vacuum pressure switch 10 is connected to the ejector block 59, set buttons 48 attached to the control module 16 are operated to set a desired pressure, while numeric values displayed on a color LCD panel 46 are observed. The set pressure indicates a pressure for bringing an output signal outputted from a semiconductor pressure sensor to an on state. When this pressure becomes lower than the set pressure and falls below a corresponding-difference range, the output signal is outputted as an off state. Such binary output signals, represented as on and off states, are supplied to an external device such as a sequencer or the like through a conductor 58.

More specifically, when one attempts to attract and feed a workpiece such as an electronic part or the like by an unillustrated suction pad, a confirmation is made as to whether or not the workpiece has been reliably sucked by the suction pad. That is, a fluid is introduced from a vacuum connecting port 20 communicating with a fluid passage defined in the ejector block 59, and communicating with a suction port of the unillustrated suction pad, and the pressure of the fluid is detected by the semiconductor sensor provided inside the body 12. When the pressure of the introduced fluid reaches the set pressure displayed on the color LCD panel 46, a rectangular operation display 60 of the connector unit 18 is turned on and an on-state signal is outputted from an unillustrated controller provided within the control module 16. Thus, the output signal detected by the semiconductor pressure sensor is supplied as an output signal to a control circuit of the controller provided within the control module 16 through a terminal 24 of the body 12. When the pressure of the introduced fluid reaches a pressure more than or equal to the set pressure displayed on the color LCD panel 46, the controller produces an on-state signal through the connector unit 18. Further, when the value of the pressure of the introduced fluid reaches a value less than the set pressure value, the controller produces or outputs an off-state signal through the connector unit 18. Thus, the on- and off-state output signals are received by the external device connected to the conductor 58 of the connector unit 18, so that a confirmation can be made as to whether or not the article or the like fed to the suction pad had been properly attracted to the suction pad.

Figure 10:
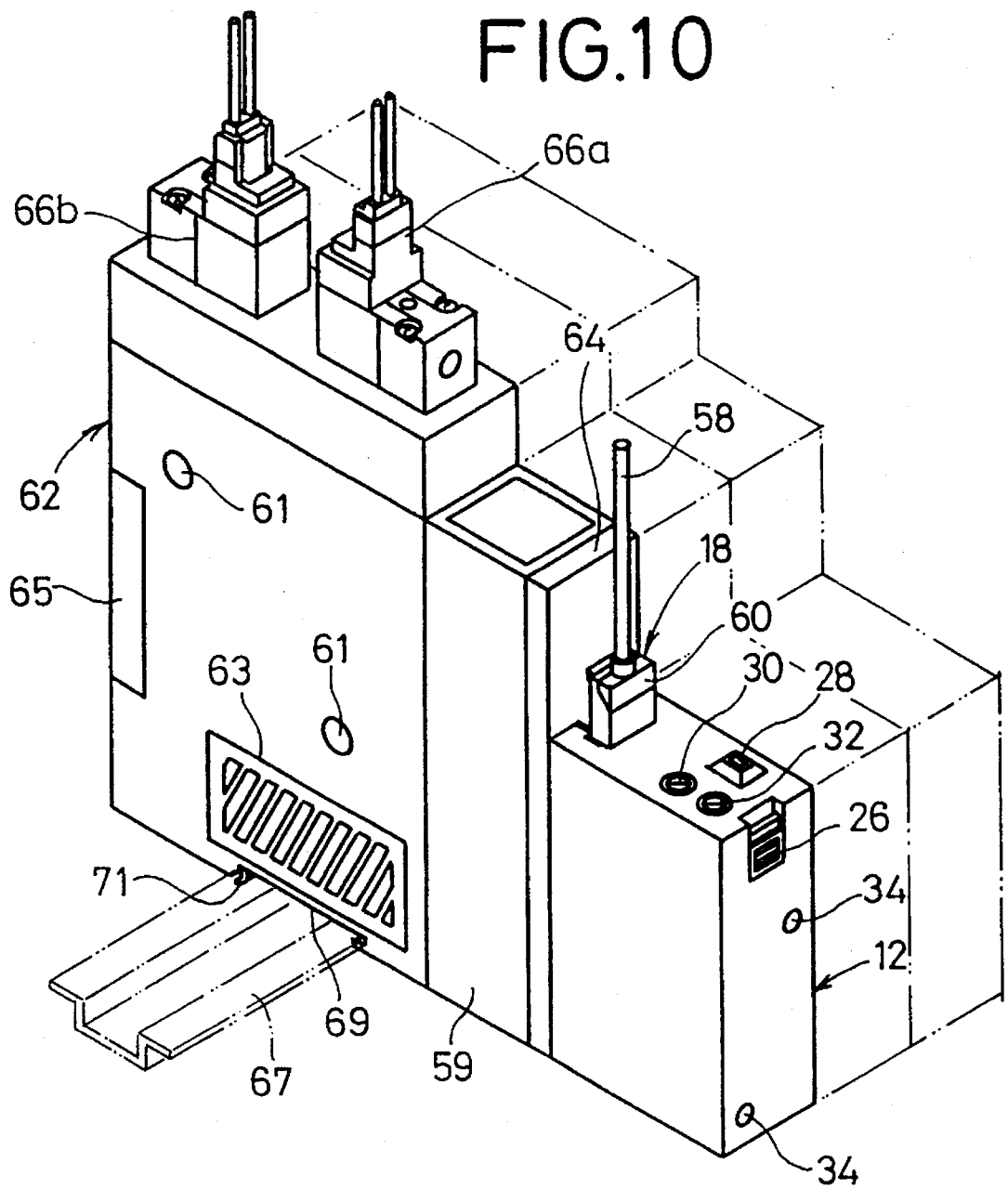
FIG. 10 is a perspective view illustrating the manner in which a connector unit has been connected to the body of the vacuum pressure switch shown in FIG. 8.

It is thus unnecessary to connect a setting section, comprised of the control unit 14 and the control module 16, to the body 12 if trouble or the like is not developed upon feeding the article by the suction pad, and after the setting of the detected pressure, the confirmation of suction, and the like have been completed. Further, the connector unit 18 having the conductor 58 can be directly connected to the terminal 24 of the body 12 (see FIG. 10).

When vacuum pressure switches are connected in a manifold configuration by a plurality of ejector blocks 59 or the like, and a plurality of works are respectively fed by a plurality of suction pads, at least one setting section comprised of the control unit 14 and the control module 16 is mounted on a plurality of bodies 12, in order to confirm whether or not the plurality of works are respectively attracted by the plurality of suction pads. Thus, set pressures can be successively set to the plurality of bodies 12. When a trouble occurs, the connector unit 18 is first drawn and separated from the terminal 24 of the body 12. The setting section comprised of the control module 16 and the control unit 14 is then connected to the body 12 again to perform a diagnosis of the inside of each vacuum pressure switch 10 and reset the pressures, thereby enabling each vacuum pressure switch 10 to be used continuously.

A description will next be made of the case where a differential pressure measuring process is executed to detect a state of clogging developed in a filter or the like using the vacuum pressure switch 10 (see FIG. 11).

Figure 11:
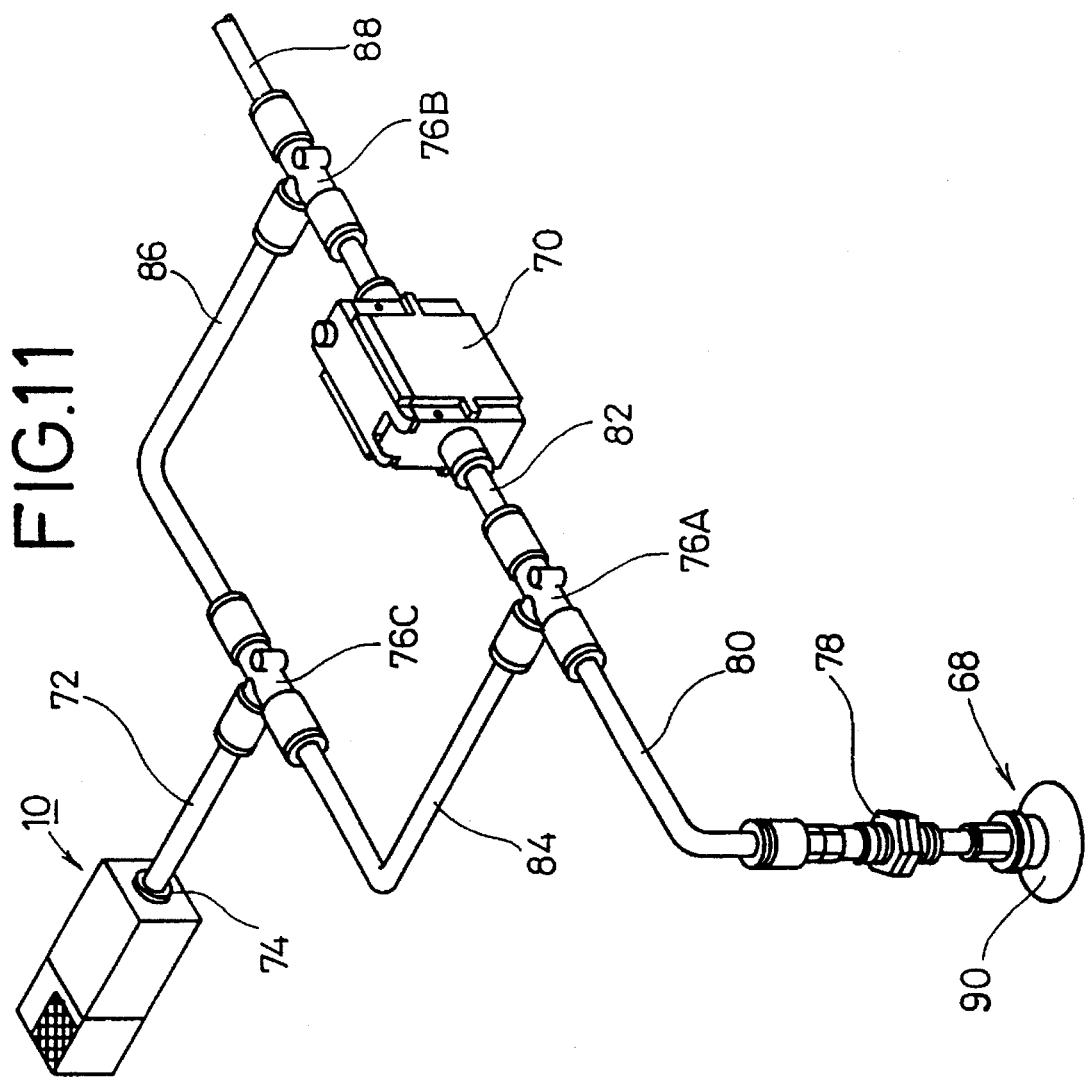
FIG. 11 is a view illustrating the manner in which a differential pressure is measured by a vacuum pressure switch.

In FIG. 11, reference numeral 68 indicates a suction pad. Further, reference numerals 70, 72 and 74 indicate a suction filter, a double tube and a double-tube joint respectively. Reference numerals 76A, 76B and 76C indicate T-shaped tube fittings respectively, and reference numeral 78 indicates a connector. Incidentally, the T-shaped tube fitting comprises a coupler or joint for connecting the double tube 72 (to be described later) to pipes or lines 84 and 86, each of which corresponds to a single passage. The connector 78 includes an unillustrated spring provided thereinside and is tightly closed by a spring. Further, the connector 78 acts on a buffer base when the suction pad 68 sucks a workpiece. Moreover, the connector 78 is externally provided with hexagonal screws so as to be attached to another actuator. Each of the ejector units shown in FIGS. 8 through 10 may also be used in place of the vacuum pressure switch 10 shown in FIG. 11.

A line 80 is connected to the suction pad 68 to which the connector 78 has been connected. The line 80 is also coupled to the T-shaped tube fitting 76A so as to branch or divide into a line 82 and a line 84 both extending in two separate directions. The line 82 is coupled to the T-shaped tube fitting 76B through the suction filter 70 so as to divide again into a line 86 and a line 88. The remaining line 84 is connected to the T-shaped tube fitting 76C, to which the vacuum pressure switch 10 is connected through a double tube 72, and to which the line 86, which branches off from the T-shaped tube fitting 76B, is connected. The double tube 72 comprises an inner tube and an outer tube which communicate respectively with the lines 84 and 86.

Under the piping arrangement referred to above, the line 88 is coupled to an unillustrated vacuum suction source. A work is attracted or sucked under a desired vacuum through a suction port (not shown) provided within a skirt 90 of the suction pad 68. The vacuum, which exists in the suction port, is detected by the vacuum pressure switch 10 through the lines 80 and 84 and the inside tube of the double tube 72. Further, the vacuum, which has passed through the suction filter 70 via the line 82 branching off from the T-shaped tube fitting 76A, is detected by the vacuum pressure switch 10 through the line 86 and the outer tube of the double tube 72. Thus, the vacuum pressure switch 10 can receive therein two fluids flowing through the inner and outer tubes of the double tube 72; one fluid flowing before it passes through the suction filter 70 and the other fluid flowing after it has passed through the suction filter 70, to thereby measure a difference in pressure between the two fluids. The differential pressure makes it possible to detect a state of clogging developed in an unillustrated filter element provided within the suction filter 70.

Switch devices according to other embodiments of the present invention will next be shown in FIGS. 12 through 16 by way of illustrative example. Incidentally, the same reference numerals as those employed in the present embodiment refer to the same structured elements as those in the above-described embodiment, and their detailed description will therefore be omitted.

Figure 12:
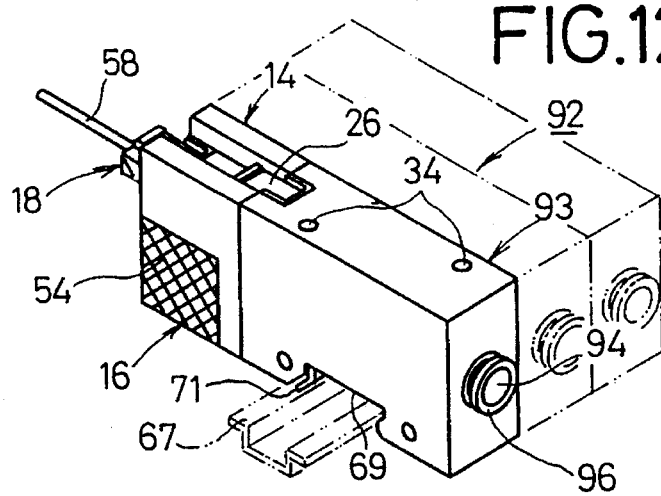
FIG. 12 is a perspective view showing a vacuum pressure switch according to another embodiment of the present invention.
Figure 13:
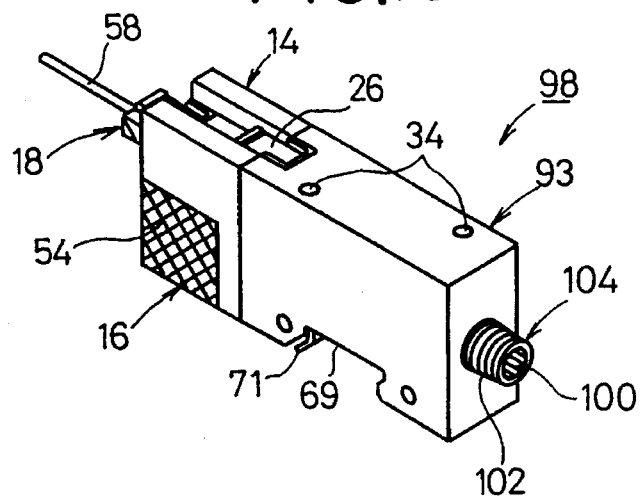
FIG. 13 is a perspective view illustrating a vacuum pressure switch according to a further embodiment of the present invention.
Figure 14:
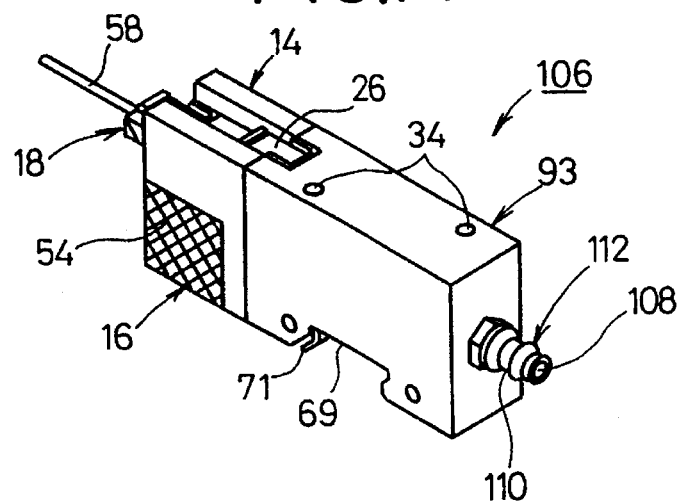
FIG. 14 is a perspective view depicting a vacuum pressure switch according to a still further embodiment of the present invention.
Figure 15:
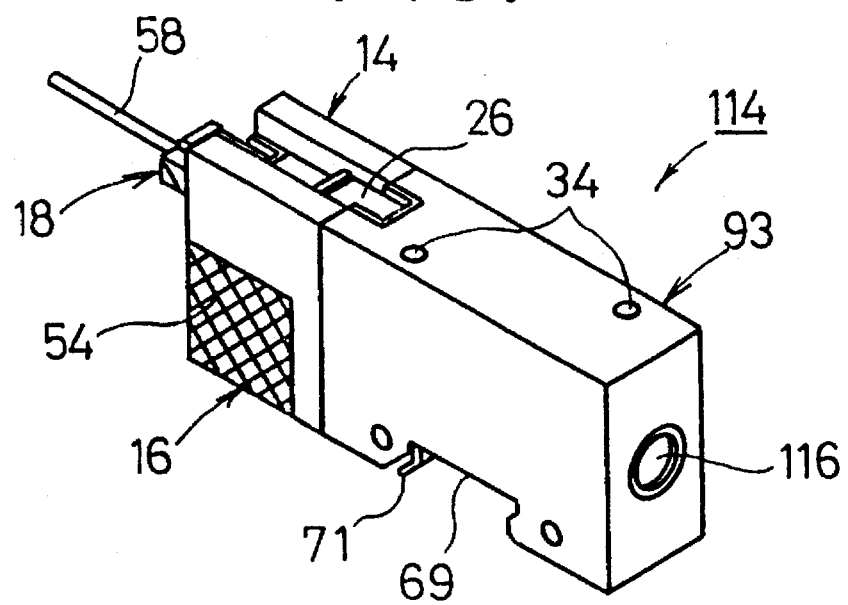
FIG. 15 is a perspective view illustrating a photoelectric switch according to a still further embodiment of the present invention.
Figure 16:
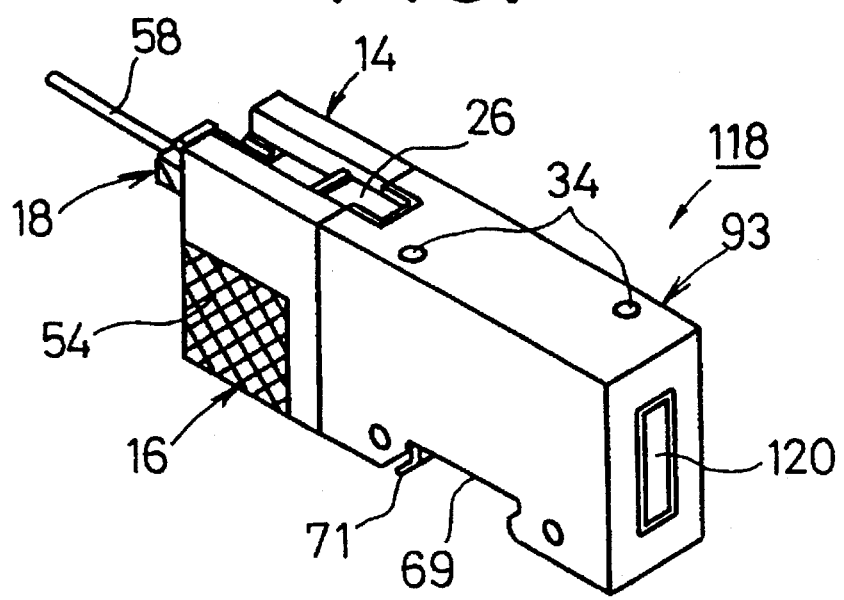
FIG. 16 is a perspective view showing a proximity switch according to a still further embodiment of the present invention.

FIGS. 12 through 16 respectively illustrate vacuum pressure switches. FIG. 12 shows a vacuum pressure switch 92 of a type wherein a one-touch type coupler or joint 96 is connected to a vacuum communicating or connecting port 94 defined in one side surface of a body 93 of the vacuum pressure switch 92. FIG. 3 depicts a vacuum pressure switch 98 of a type wherein a projection 104 having a male screw 102 is coupled to a vacuum communicating or connecting port 100 of the vacuum pressure switch 98. Further, FIG. 14 shows a vacuum pressure switch 106 of a type wherein a tube fitting 112 having a tapered edge 110 is connected to a vacuum communicating or connecting port 108 of the vacuum pressure switch 106. FIG. 15 illustrates a photoelectric switch 114 (or a converging means of a type wherein a photosensor or light-sensitive device is provided so as to extend outside via an optical fiber) of a type wherein a circular light-receiving/light-emitting device 116 formed in one side surface of a body 93 of the photoelectric switch 114 senses a variation in irradiated light to thereby produce an output signal. The photoelectric switch 114 has the advantage that it is not affected by magnetic fields. FIG. 16 illustrates a proximity switch 118 of a type wherein a substantially-rectangular sensor 120 provided on one side surface of a body 93 of the proximity switch 118 detects a variation in impedance, to thereby produce an output signal.

The switch device according to the present invention can be applied to any of the various switches referred to above.

Figure 17:
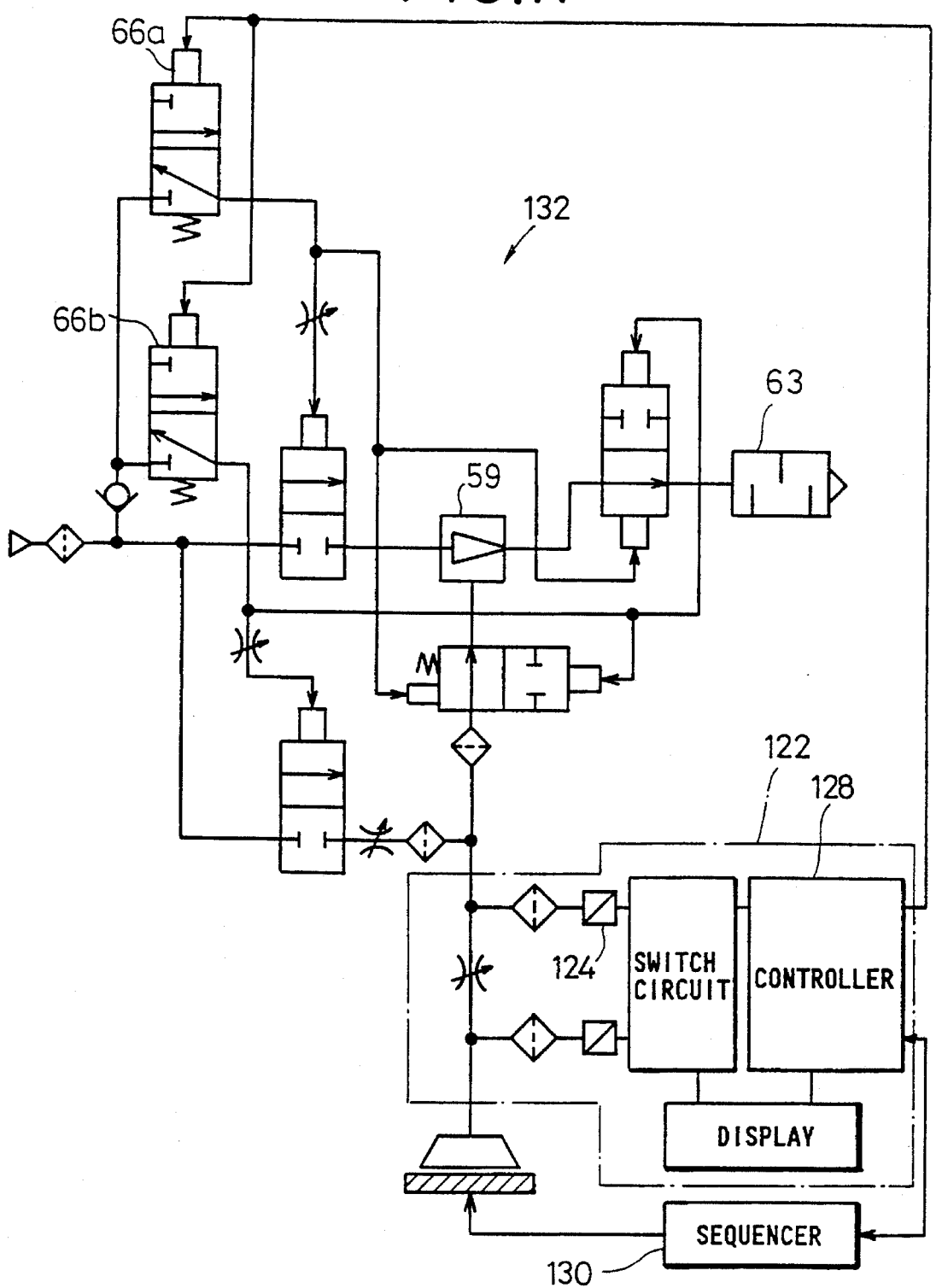
FIG. 17 is a view for describing a circuit employed in a still further embodiment of the present invention.

As shown in FIG. 17, according to the present invention, two semiconductor sensors A124 and B126 each of which may comprise either a resistance or capacitance type, are provided in combination within a switch device 122. Further, a filter, or hydrophobic element (e.g., a polytetrafluoroethylene film) or the like is used to prevent the sensors A124 and B126 from being affected by dust and water or moisture.

Thus, a vacuum generation valve, a vacuum break valve, a vacuum on/off valve, a vacuum generator exhaust or discharge on/off valve, and an actuator controller for operating on a workpiece are operated in advance during normal operation, or in the course of operation, to thereby decide based on the state of a pressure given from the vacuum generator whether the work has been suitably attracted, or released by a suction malfunction or the like. Then, a signal indicative of data about the operation is sent to either a controller 128 in the switch device 122 or a sequencer 130 based on the result of the decision.

Further, the sensor A124 suitably changes a value depending on the decision of either a suction success, i.e. yes, or a suction failure, i.e. no, by the sensor B126, according to variations in pressure supplied from the vacuum generator 132 (or alternatively a vacuum pump). For example, an automatic shifting method is adopted wherein each of the pressures detected by the sensor B126 upon suction or non-suction is calculated, predicted and judged from the pressure detected by the sensor A124, so that a "yes" or "no" decision is made at a pressure value of 50%.

A description will next be made of a network system 160 according to the present invention, wherein a wiring structure which is disposed between control devices and sensors, i.e., a control device-to-sensor wiring structure, is connected to each of vacuum pressure switches 10 and each of semiconductor pressure sensors 15 respectively disposed within the vacuum pressure switches 10, wherein the wiring structure does not require a power line. Incidentally, the vacuum pressure switch 10 is identical in structure and operation to the aforementioned embodiment shown in FIG. 2, and hence a detailed description thereof will be omitted.

Figure 18:
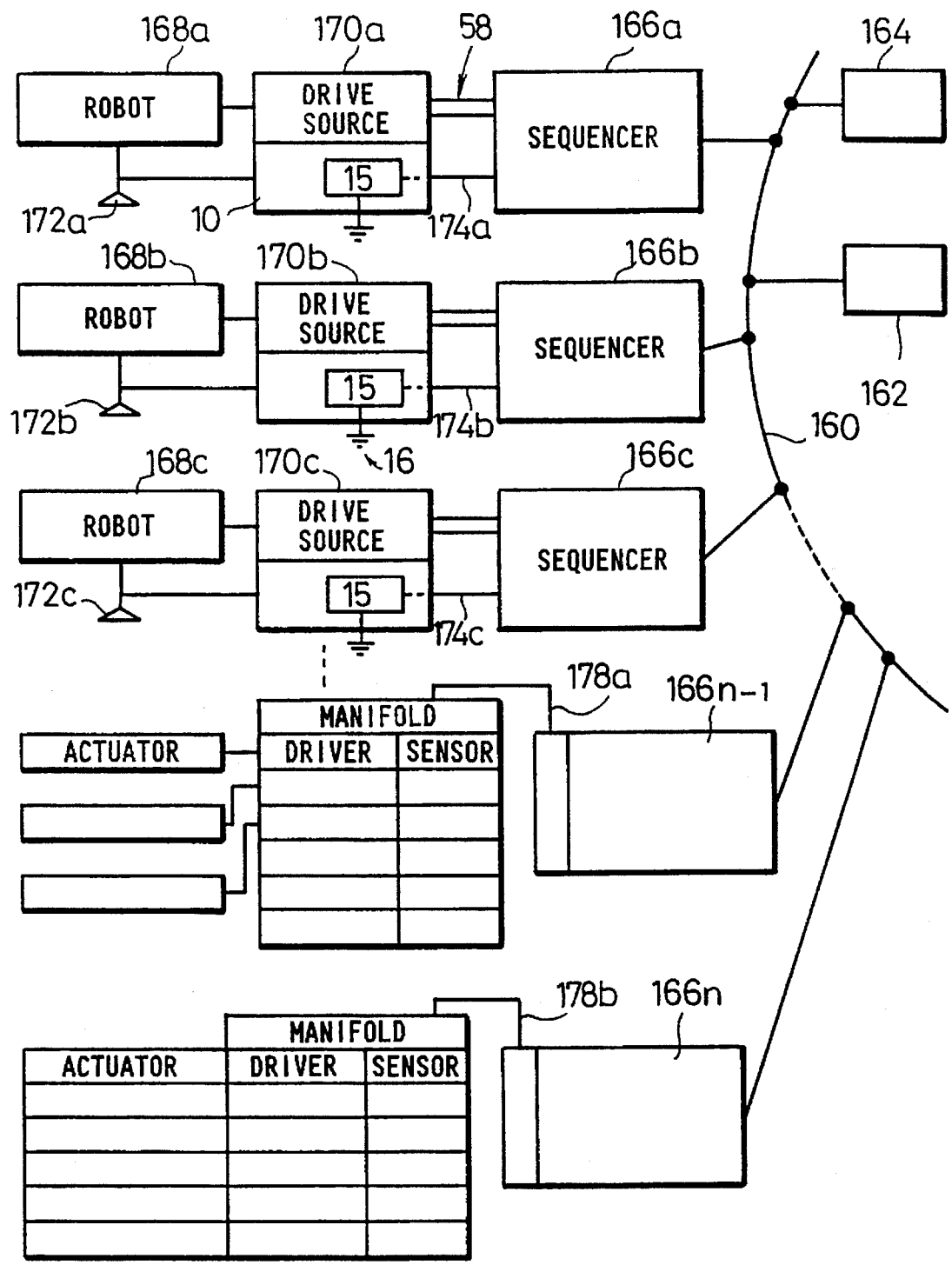
FIG. 18 is a view schematically illustrating the manner in which sequencers, actuators and a network system are connected to one another by a wiring structure according to the present invention.

FIG. 18 shows a typical network system 160. Main control devices 162 and 164 are electrically connected respectively to the network system 160. The network system 160 may include a wireless LAN. Further, the network system 160 includes sequencers 166a through 166n, which are electrically connected to corresponding drive sources 170a through 170n, each of which is used to energize an actuator. For example, the drive source 170a is electrically connected to the sequencer 166a to drive the robot 168a. Further, the vacuum pressure switch 10 is connected to a suction pad 172a attached to a leading end portion of an arm of the robot 168a. The vacuum pressure switch 10 is connected to the sequencer 166a.

As is easily understood from FIG. 18, a lead wire or signal line 174a for connecting the semiconductor pressure sensor 15 of the vacuum pressure switch 10 to the sequencer 166a is shaped in the form of a single line included in a conductor unit 58. Further, a power line is not required to be connected to each of the semiconductor pressure sensors 15. Incidentally, each semiconductor pressure sensor 15 is grounded.

Similarly, each of the sequencers 166b through 166n utilizes the same construction as that used for the sequencer 166a. Accordingly, robots 168b through 168n, drive sources 170b through 170n, and the other semiconductor pressure sensors 15 and signal lines 174b through 174n will not be described in detail.

In the case of the sequencers 166n-1 and 166n, cylinders may be used as actuators in place of the robots 168b through 168n, by way of illustrative example. Further, magnetic sensors may be used as sensors. The drivers and sensors are provided on each manifold block. Further, a manifold including sequencers 166n-1, and a manifold including the sequencer 166n are connected to one another by serial transmission lines 178a and 178b, respectively. Power sources, or power and control signals, are supplied through the serial transmission lines 178a and 178b. Further, signals detected by the sensors are sent back to the corresponding sequencers 166n-1 and 166n through the serial transmission lines 178a and 178b. In this case, the serial transmission lines 178a and 178b may be made wireless. Further, if microwaves are sent by wireless transmission, then either the drivers or the sensors on each manifold can be driven by such transmission. Thus, the use of microwaves makes it possible to transmit both power and signals. The transmitted power can also be used as a power source or supply for other devices.

Operation of the network system 160 constructed as described above will next be described below.

When a work is fed by the suction pads 172a, 172b and 172c respectively attached to robot arms 168a, 168b and 168c, power and control signals are supplied to the drive source 170a from the sequencer 166a, for example. At this time, the semiconductor pressure sensor 15 can detect whether the work is being properly sucked by the suction pad 172a to thereby confirm its state based on the result of such a detection. Next, a signal indicative of the confirmed state is taken in the network system 160 through the signal line 174a. The signal can be made available for subsequent control operations of each of the main control devices 162 and 164, for example.

As is apparent from FIG. 18, the conductor unit 58 of each vacuum pressure switch 10 need not include a power line for supplying power to the semiconductor pressure sensor 15. Only the signal lines 174*a* through 174*n* are respectively electrically connected to the semiconductor pressure sensors 15. Further, a power source having a different structure, such as a solar battery or the like, may be used as the power source for the semiconductor pressure sensor 15. Alternatively, a leakage current, which leaks from the sequencer 166*a* and the drive source 170*a*, may be used. As a result, a dedicated power line can be omitted.

Particularly, since the drivers which are placed on the manifolds and respectively connected to the sequencers 166*n*-1 and 166*n*, and the sensors which are additionally provided along with the drivers, are relatively disposed adjacent to one another, the invention has the further advantage that a leakage current can be easily used as the power source.

Figure 19:
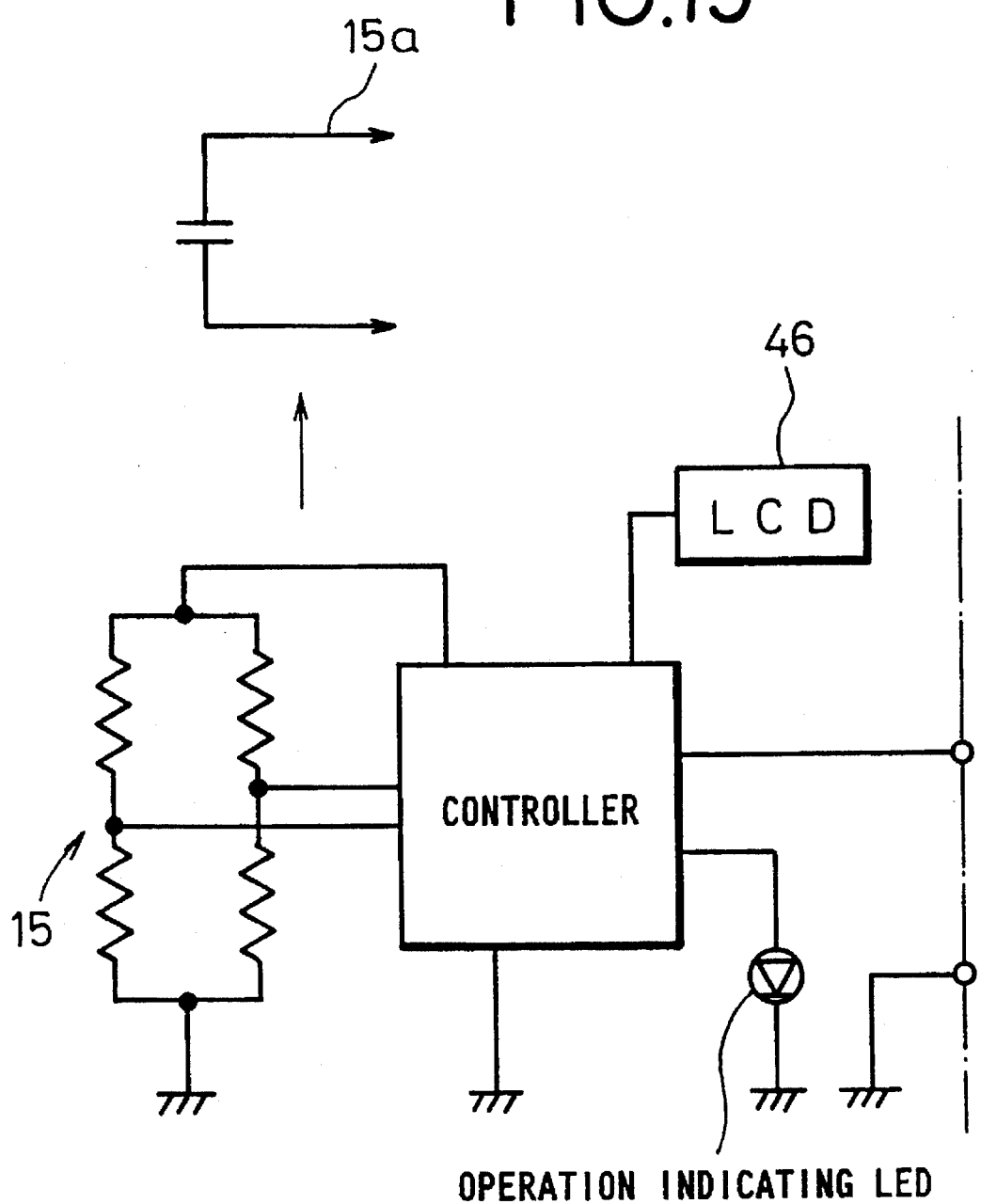
FIG. 19 is a view schematically showing a capacitance type pressure sensor used as an alternative to a semiconductor pressure sensor in FIG. 18.

The same advantageous effects as described above can be brought about even if a capacitance-type pressure sensor 15*a* is used as an alternative to the semiconductor pressure sensor 15, as illustrated in FIG. 19 by way of example.

INDUSTRIAL APPLICABILITY

As has been described above, according to the present invention, both the switch device and the wiring structure suitable for use in the switch device are employed in a network system, for feeding a work by a suction pad mounted to either an arm of a robot or an actuator or the like under control of a sequencer, for example.

We claim:

1. A switch device comprising:
    a main body comprising a sensor disposed therein for producing an electrical signal in response to a predetermined air pressure applied to said sensor and a terminal connected to said sensor through which the electrical signal is output;
    a setting section detachably mounted on said main body, said setting section comprising a control unit and display means, said control unit connected to the terminal for receiving the electrical signal and externally outputting a detection signal through a signal line detachably connected to the control unit, said detection signal comprising an on-state signal and an off-state signal depending on the electrical signal outputted by said sensor, and said display means displaying thereon detection signal determining conditions which have been set in advance;
    wherein said setting section further comprises a control module, said control module having said display means therein, and wherein said control module is detachably mounted on said control unit.

2. The switch device according to claim 1, wherein said control unit and said control module are electrically connected through a rubber connector.

3. The switch device according to claim 1, wherein said control unit is formed in either a rectangle shape or a rectangular parallelopiped shape and has a wall at one corner thereof for defining a space formed in either a rectangle shape or a rectangular parallelopiped shape, and
    wherein said control module is formed substantially in either a cube shape or a triangular pole shape and slidable substantially in either a vertical direction or a horizontal direction against said wall to thereby engage with said control unit into one body.

4. The switch device according to claim 1, wherein said signal line externally outputs said detection signal receives said detection signal determining conditions from outside, and wherein said signal line also serves as an electric power supply line to said sensor.

5. The switch device according to claim 1, wherein said main body comprises an electrical connector for allowing said signal line to be directly connected to said main body without passing through said control unit.

6. The switch device according to claim 1, wherein said signal line comprises a wireless transmission line.

7. The switch device according claim 6, wherein said wireless transmission line is a microwave transmission line.

8. The switch device according to any of claims 1, 2 or 3, wherein said device comprises connecting means for connecting a plurality of said devices to one another.

9. The switch device according to any of claims 1, 2 or 3, wherein said device is combined with a sequencer to form a control system.

10. The switch device according to any of claims 1, 2 or 3, wherein said device is connected to a network system.

11. A system comprising:
    at least one switch, each switch comprising,
    a main body including a terminal and a sensor disposed therein, said sensor for providing an electrical signal to the terminal which is connected to said sensor, said terminal for receiving at least one of a detachably mounted connector and a detachably mounted setting section that receives said detachable connector;
    a sequencer serving as a control device for outputting a detection signal to a controlled device; and
    a control device-to-sensor wiring structure for connecting the terminal and the controlled device to the sequencer, said control device-to-sensor wiring structure including a signal transmitting means connected to the switch terminal for transmitting the electrical signal provided by the sensor to the sequencer, wherein the sequencer produces the detection signal based on the sensor's electrical signal.

12. The system according to claim 11, wherein the control device-to-sensor wiring structure provides a power source to the sensor from at least one of a leakage current from said sequencer, a wireless transmission means, and a solar battery.

13. The system according to claim 11, wherein the signal transmitting means is a wireless signal transmitting means.

\* \* \* \* \*